(12) United States Patent
Crocherie et al.

(10) Patent No.: US 9,859,319 B2
(45) Date of Patent: Jan. 2, 2018

(54) COLOR IMAGE SENSOR AND METHOD OF MANUFACTURING THE SAME

(71) Applicants: STMICROELECTRONICS SA, Montrouge (FR); STMICROELECTRONICS (CROLLES 2) SAS, Crolles (FR)

(72) Inventors: Axel Crocherie, Grenoble (FR); Jean-Pierre Oddou, Champagnier (FR); Stéphane Allegret-Maret, Grenoble (FR); Hugues Leininger, Crolles (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/923,799

(22) Filed: Oct. 27, 2015

(65) Prior Publication Data

US 2016/0233258 A1 Aug. 11, 2016

(30) Foreign Application Priority Data

Feb. 10, 2015 (FR) ...................................... 15 51035

(51) Int. Cl.
*H01L 31/0232* (2014.01)
*H01L 27/146* (2006.01)

(52) U.S. Cl.
CPC .... *H01L 27/14621* (2013.01); *H01L 27/1463* (2013.01); *H01L 27/1464* (2013.01); *H01L 27/14607* (2013.01); *H01L 27/14636* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 7,800,192 B2* | 9/2010 | Venezia | H01L 27/1463 257/291 |
| 8,436,440 B2 | 5/2013 | Marty et al. | |
| 8,610,229 B2* | 12/2013 | Hsu | H01L 27/14623 257/432 |
| 2008/0197388 A1 | 8/2008 | Park et al. | |
| 2010/0176474 A1* | 7/2010 | Kwon | H01L 27/14621 257/432 |
| 2011/0101481 A1* | 5/2011 | Nozaki | H01L 27/14601 257/432 |
| 2015/0187826 A1 | 7/2015 | Suzuki | |

FOREIGN PATENT DOCUMENTS

JP 2011003860 1/2011

* cited by examiner

*Primary Examiner* — Hung Vu
(74) *Attorney, Agent, or Firm* — Slater Matsil, LLP

(57) ABSTRACT

A color image sensor including an array of pixels is formed in a semiconductor layer having a back side that receives an illumination. Insulated conductive walls penetrate into the semiconductor layer from the back side and separate the pixels from one another. For each pixel, a color pixel penetrates into from 5 to 30% of a thickness of the semiconductor layer from the back side and occupies at least 90% of the surface area delimited by the walls. An electrically-conductive layer extends from the lateral wall of the filter all the way to the walls.

8 Claims, 3 Drawing Sheets

COLOR IMAGE SENSOR AND METHOD OF MANUFACTURING THE SAME

FIELD OF THE INVENTION

The present disclosure relates to a color image sensor and to a method of manufacturing the same.

BACKGROUND

Color image sensors comprising a network or an array of pixels formed in a semiconductor layer having a first side, called a front side, coated with an interconnection structure and having a second side, called a back side, intended to receive an illumination, are known. In such color image sensors, each pixel is separated from the adjacent pixels by insulating structures extending vertically between the front side and the back side of the semiconductor layer. Each pixel is topped with a color filter arranged above the back side of the semiconductor layer. The color filters of adjacent pixels are positioned side by side. To concentrate in each pixel the received light intensity, each color filter is currently topped with a microlens.

A disadvantage of such color image sensors is that a light ray having at least partially crossed the color filter corresponding to a given pixel may sometimes reach a neighboring pixel. Another disadvantage of such sensors is that the materials forming two adjacent filters of different colors may mix.

SUMMARY

The present disclosure is directed to a method of manufacturing a color image sensor overcoming at least some of the disadvantages of existing sensors.

Thus, one embodiment provides a method of manufacturing a color image sensor comprising an array of pixels formed in a semiconductor layer, with the method comprising the successive steps of etching insulating trenches penetrating into the semiconductor layer and separating the pixels from one another; depositing an insulating coating and an electrically-conductive material filling the insulating trenches; for each pixel, etching a cavity crossing the electrically conductive material, penetrating into from 5 to 30% of the thickness of the semiconductor layer, and occupying at least 90% of the surface area delimited by the insulating trenches; and filling each cavity with a color filtering material.

The electrically-conductive material may be opaque to light. The electrically-conductive material may be a metal. An electrically-conductive coating layer opaque to light may be deposited on the insulating coating before the deposition of the electrically-conductive material, and the cavity may be etched through the conductive coating layer. The conductive coating layer may be made of a metal or of a metal nitride. The insulating trenches may penetrate into three quarters at least of the thickness of the semiconductor layer.

Another embodiment provides a color image sensor comprising an array of pixels formed in a semiconductor layer having a back side intended to receive an illumination; insulated conductive walls penetrating into the semiconductor layer from its back side and separating the pixels from one another; and for each pixel, a color filter penetrating into from 5 to 30% of the thickness of the semiconductor layer from its back side and occupying at least 90% of the surface area delimited by the walls, and an electrically-conductive layer extending from the lateral wall of the filter all the way to the walls.

The walls may comprise an electrically-conductive material coated with an insulating layer, and the electrically-conductive layer may be made of the electrically-conductive material. The electrically-conductive material may be opaque to light. The walls may penetrate into three quarters at least of the thickness of the semiconductor layer.

BRIEF DESCRIPTION OF THE DRAWINGS

The foregoing and other features and advantages will be discussed in detail in the following non-limiting description of specific embodiments in connection with FIGS. 1 to 7, which are simplified cross-sectional views illustrating steps for manufacturing an example color image sensor.

DETAILED DESCRIPTION

Figure 1:
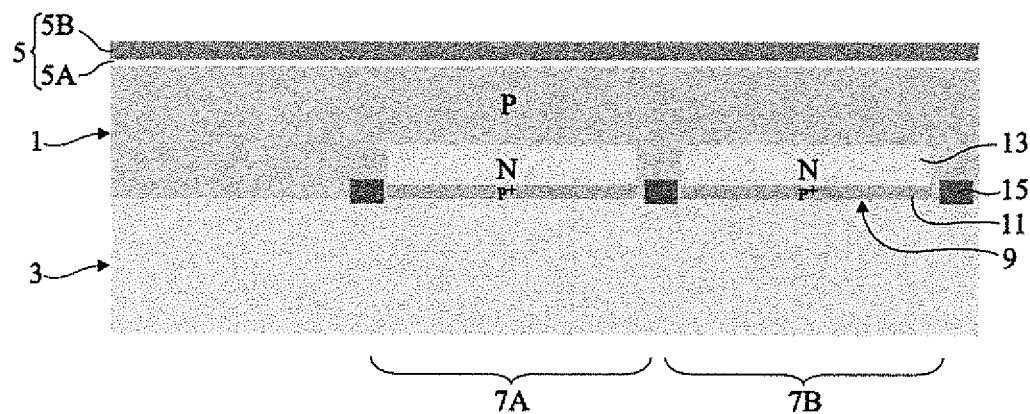

The same elements have been designated with the same reference numerals in the different drawings and, further, the various drawings are not to scale. In the following description, terms qualifying position such as terms left-hand, top, higher, lower, vertical, lateral, etc., refer to concerned elements in the corresponding drawings.

FIG. 1 is a simplified cross-sectional view showing a structure at an intermediate step of a method of manufacturing a color image sensor. The structure comprises a P-type doped semiconductor layer 1. The front surface (the lower surface in FIG. 1) of semiconductor layer 1 is coated with an interconnection structure 3 formed of portions of conductive layers connected by conductive vias and separated by insulating layers. Interconnection structure 3 is laid on a support, or handle, which is not shown. The back side of semiconductor layer 1 (the upper surface in FIG. 1) is coated with a stack 5 of insulating layers, for example, a silicon oxide layer 5A and a silicon nitride layer 5B laid on layer 5A. Semiconductor layer 1 comprises an array of pixels and components, not shown, such as transistors formed on its front side. Two adjacent pixels 7A and 7B each comprising a photodiode 9 are shown. Each photodiode 9 comprises a vertical stack of doped layers, for example, successively comprising, from the front side of the semiconductor layer 1, a heavily-doped P-type layer 11 (P$^+$), an N-type doped layer 13, and a portion of P-type doped semiconductor layer 1. Shallow insulating areas 15, for example, made of silicon oxide, are shown on the front side of the semiconductor layer 1 at the limit of each of the pixels 7A and 7B.

As an example, semiconductor layer 1 is made of silicon. The semiconductor layer may be a thin layer having a thickness from 3 to 6 µm, for example, 4 µm. Silicon oxide layer 5A is, for example, a thermal oxide layer having a thickness from 5 to 10 nm, for example, 7 nm. The thickness of the silicon nitride layer 5B may be from 50 to 60 nm, for example, 55 nm. In a top view, each pixel 7 may have the shape of a square having a side length from 0.9 to 2 µm, for example, 1.5 µm.

Figure 2:
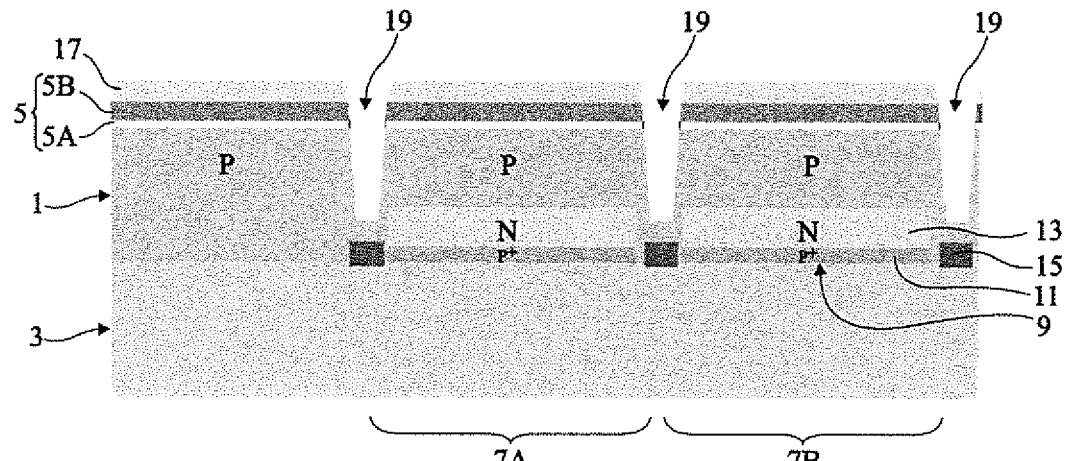

FIG. 2 is a simplified cross-sectional view showing the structure of FIG. 1 after the deposition and the etching of a masking layer 17 on the insulating stack 5 and after the etching of deep insulation trenches 19, or DTI (Deep Trench Isolation), crossing insulating stack 5 and penetrating into the semiconductor layer 1. The deep insulating trenches 19 penetrate into the semiconductor layer 1 across at least half and preferably three quarters of its thickness, or also across its entire thickness. The trenches 19 separate the adjacent pixels 7A and 7B and are aligned with shallow insulation areas 15.

As an example, the trenches 19 may have a width from 150 to 250 nm, for example, 200 nm. The masking layer 17 may be a silicon oxide layer having a thickness from 100 to 300 nm, for example, 200 nm.

Figure 3:
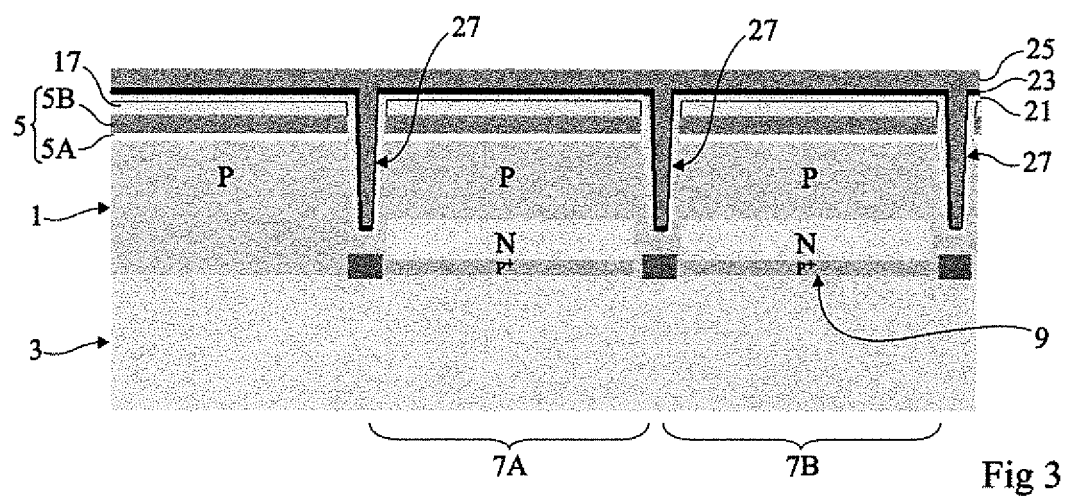

FIG. 3 is a simplified cross-sectional view showing the structure of FIG. 2 after successive depositions across its entire surface exposed on the back side of the semiconductor layer 1. Such successive depositions comprise the deposition of an insulating layer 21 and of an electrically-conductive layer 23 on the walls and the bottom of trenches 19, followed by the deposition of an electrically-conductive layer 25 filling the trenches 19 to form insulated conductive walls 27. The thickness and the material of layer 23 and/or of layer 25 are selected so that at least one of the conductive layers 23 and 25 is opaque to the light which will be received by the sensor in operation.

As an example, insulating layer 21 is formed by conformal deposition of silicon oxide with a thickness from 7 to 15 nm, for example, 10 nm. The material of the electrically-conductive layer 23 may be a metal, for example, titanium or tantalum or a metal nitride, for example, titanium nitride or tantalum nitride. The thickness of the conductive layer 23 is from 10 to 50 nm, for example, 30 nm. The material of the conductive filling layer 25 is preferably a metal, for example, tungsten.

Figure 4:
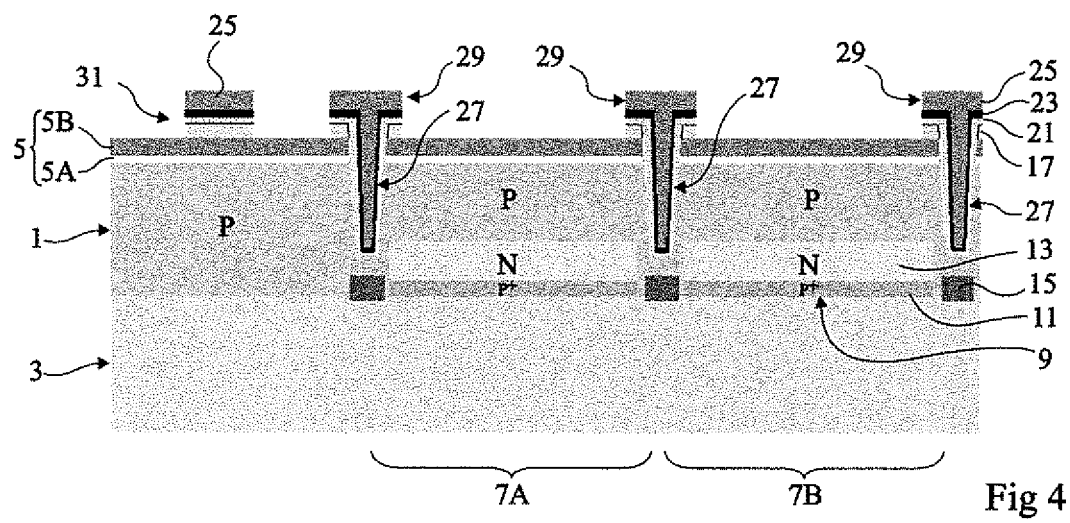

FIG. 4 is a simplified cross-sectional view showing the structure of FIG. 3 after the partial removal by etching of the layers 25, 23, 21, and 17 arranged above insulating stack 5, with the silicon nitride layer 5B being used as an etch stop layer. Above each pixel 7A, 7B, layers 25, 23, 21, and 17 are removed from at least 90% of the surface area delimited by the walls 27. Portions 29 of the stack of layers 17, 21, 23, and 25 are left in place above the walls 27 and laterally protrude on either side of the walls 27. A portion 31 of the stack of layers 17, 21, 23, and 25 is also left in place above a portion of the semiconductor layer deprived of pixels and of the walls 27 (on the left-hand side of FIG. 4). Although this has not been shown in FIG. 4, there is a continuity zone between the conductive layers 23 and 25 of the stack portions 29 and 31.

Figure 5:
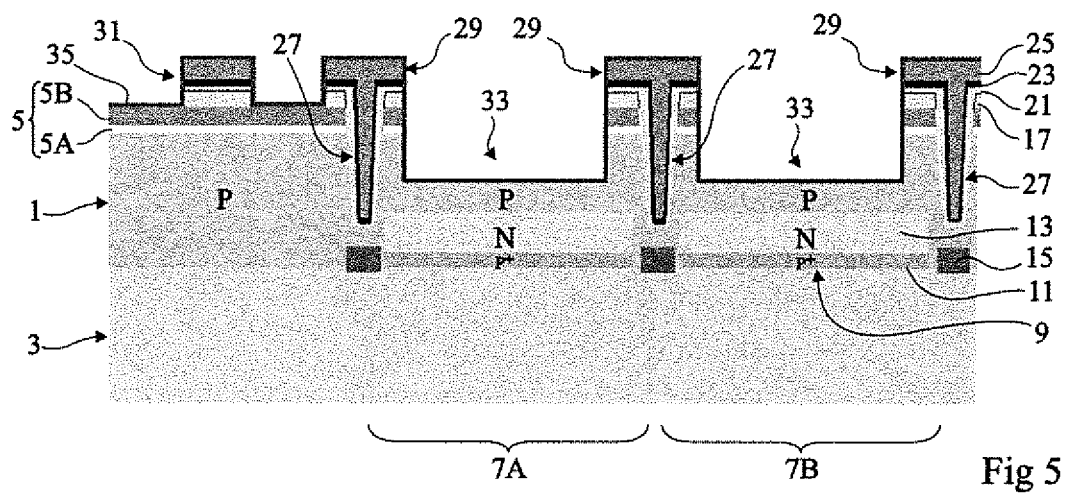

At the step illustrated in FIG. 5, etched above each pixel 7A, 7B is a cavity 33 having edges aligned with those of the portions 29 of the stack of layers 17, 21, 23, and 25. Each cavity 33 crosses conductive layers 23 and 25, and penetrates into from 5 to 30% of the thickness of the semiconductor layer 1. A silicon nitride layer 35 enriched with silicon has then been deposited over the entire exposed surface area of the structure, on the back side of the semiconductor layer. As an example, the thickness of silicon nitride layer 35 is from 10 to 60 nm, for example, 15 nm.

Figure 6:
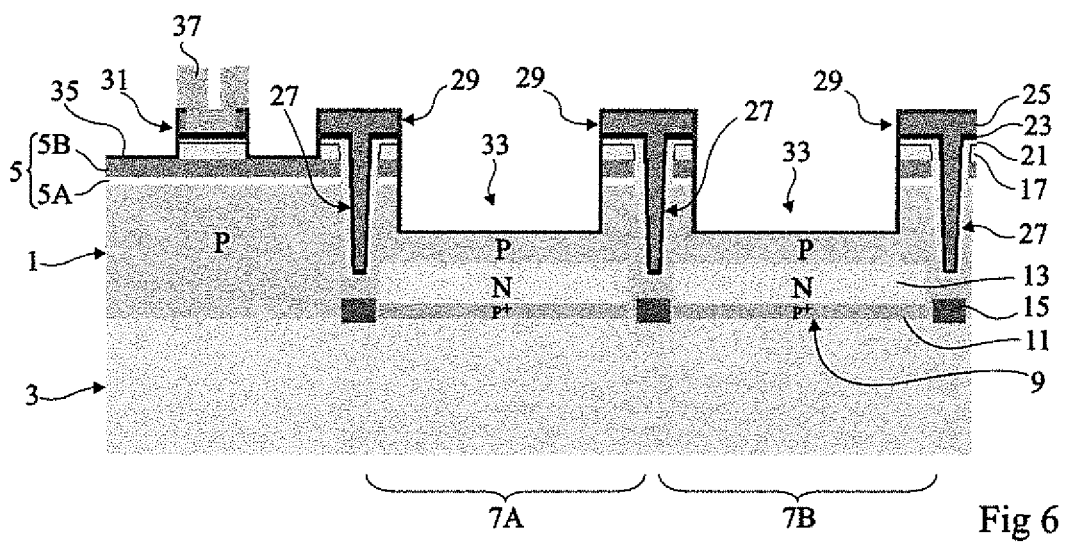

At the step shown in FIG. 6, a metal contact 37 with the conductive layer 23 has been formed at the level of portion 31 of the stacked layers 17, 21, 23, and 25 by etching a trench crossing layers 35 and 25 all the way to the conductive layer 23 and then by depositing a metal, for example, aluminum, filling this trench. The contact 37 may be formed at the same time as insulated connections running from the interconnection structure 3 up to the back side of semiconductor layer 1. Such insulated connections are formed by etching openings from the back side of the semiconductor layer 1 all the way to the interconnection structure 3, by depositing an insulating layer, for example, silicon oxide, on the entire exposed surface of the structure on the back side of the semiconductor layer, and by depositing a metal in these openings. In this case, the metal of contact 37 and of the insulated connections may be simultaneously deposited.

Figure 7:
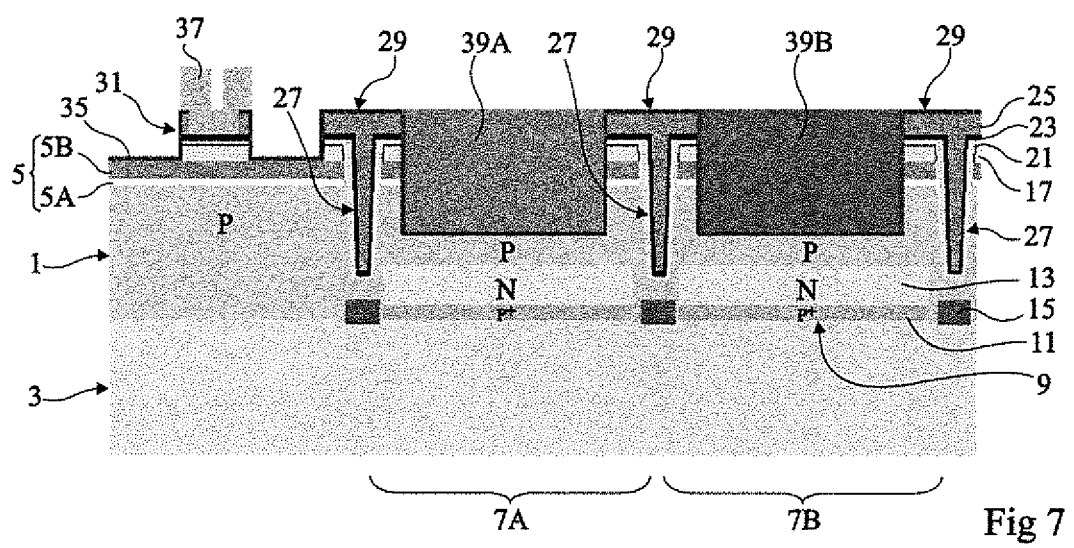

At the step illustrated in FIG. 7, cavity 33 opposite pixel 7A has been filled with a color filtering material 39A corresponding to a first color, and cavity 33 opposite pixel 7B has been filled with a color filtering material 39B corresponding to a second color. The materials 39A and 39B are flush with the level of the surface of layer 35 covering portions 29 of the stack of layers 17, 21, 23, and 25. As an example, materials 39A and 39B are polymer resins (colored or not). At a step, not illustrated, a microlens may be arranged on each filter 39A and 39B.

The structure of FIG. 7 forms a color image sensor where each pixel formed in a semiconductor layer is topped with a color filter partially buried in this semiconductor layer, each pixel and its filter are separated from the neighboring pixels and filters by insulated conductive walls.

A first advantage of such a sensor is that two neighboring filters are separate, which enables to avoid, on forming of the color filters, a possible mixing of the materials forming the filters.

A second advantage is that the filters are formed in cavities, whereby the filters bond better to the sensor than in the case where the filters are formed on a planar surface. This better bonding of filters facilitates the resolution of colored resins, particularly for small pixels smaller than 1 µm.

In operation, the color image sensor is illuminated on the back side of the semiconductor layer 1 and the layer 35 is used as an antireflection layer. Further, the conductive layers 23 and 25 of walls 27 may be biased via contact 37. Due to the fact that, as described in relation with FIG. 3, conductive layers 23 and 25 are opaque to the light received by the sensor, when a light ray obliquely reaches the upper surface of the color filter of a given pixel, this ray remains confined between the walls 27 delimiting this pixel. Further, when a light ray reaches the upper surface of a portion of stack 29 between two neighboring filters, the ray does not penetrate into semiconductor layer 1.

Thus, a third advantage of such a sensor is that only light rays having crossed the color filter of a given pixel reach the photodiode of this pixel. This results in an improvement of the images acquired by such a sensor.

A fourth advantage of this sensor is that, due to the fact that the microlenses topping the color filters are essentially used to avoid a light ray to successively cross two different adjacent color filters, such microlenses may be suppressed, which decreases the complexity and the manufacturing cost of the sensor.

Specific embodiments have been described. Various alterations and modifications will occur to those skilled in the art. In particular, the present invention is not limited to pixels comprising the photodiodes 9 such as described in relation with FIG. 1. For example, the photodiodes may comprise no $P^+$ layer 11, or also, the photodiodes may extend laterally all the way to the walls 27.

The number of layers and the materials of the layers of the insulating stack 5 may be different from what has been described in relation with FIG. 1. It is also possible not to provide an insulating stack 5 on the back side of semiconductor layer 1.

The insulating structures separating adjacent pixels of the sensor may be adapted by those skilled in the art. For example, the shallow insulation areas 15 formed on the front side of the semiconductor layer may be omitted. A doping step may also be provided before the filling of the trenches 19 to form a heavily-doped layer bordering walls 27 in the semiconductor layer 1. The insulating layer 21 may be formed by successive depositions of a plurality of insulating layers, for example, a silicon oxide layer and a silicon nitride layer.

Although, in the previously-described color image sensor, only two adjacent pixels 7A and 7B associated with two different colors have been shown, in practice, a color image sensor comprises a very large number of pixels, for example, several million, and more than two filter colors are currently provided, for example, three.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A color image sensor comprising:
   a semiconductor layer having a back side to receive an illumination;
   an array of pixels in said semiconductor layer;
   insulated conductive walls penetrating into said semiconductor layer from the back side and separating the pixels from one another; and
   for each pixel, a color filter penetrating into from 5 to 30% of a thickness of said semiconductor layer from the back side and occupying at least 90% of a surface area delimited by the insulated conductive walls, and with an electrically-conductive layer extending from a lateral wall of the color filter to the insulated conductive walls.

2. The color image sensor of claim 1, wherein the insulated conductive walls comprise an electrically-conductive material coated with an insulating layer, and the electrically-conductive layer comprises the electrically-conductive material.

3. The color image sensor of claim 2, wherein the electrically-conductive material is opaque to light.

4. The color image sensor of claim 2, wherein the insulated conductive walls penetrate into at least three quarters of a thickness of said semiconductor layer.

5. An image sensor comprising:
   a semiconductor layer having a back side to receive an illumination;
   an array of pixels in said semiconductor layer;
   insulated conductive walls penetrating into said semiconductor layer from the back side and separating the pixels from one another; and
   for each pixel, a filter penetrating into from 5 to 30% of a thickness of said semiconductor layer from the back side and occupying at least 90% of a surface area delimited by the insulated conductive walls, and with an electrically-conductive layer extending from a lateral wall of the filter all the way to the insulated conductive walls.

6. The image sensor of claim 5, wherein the insulated conductive walls comprise an electrically-conductive material coated with an insulating layer, and the electrically-conductive layer comprises the electrically-conductive material.

7. The image sensor of claim 6, wherein the electrically-conductive material is opaque to light.

8. The image sensor of claim 5, wherein the insulated conductive walls penetrate into at least three quarters of a thickness of said semiconductor layer.

* * * * *